United States Patent
Shimizu et al.

(10) Patent No.: US 9,434,046 B2
(45) Date of Patent: Sep. 6, 2016

(54) POLISHING COMPOSITION AND POLISHING METHOD USING THE SAME

(71) Applicant: Fujimi Incorporated, Kiyosu-shi (JP)

(72) Inventors: Mikikazu Shimizu, Komaki (JP); Tomohiko Akatsuka, Ichinomiya (JP); Kazuya Sumita, Kakamigahara (JP)

(73) Assignee: Fujimi Incorporated, Kiyosu-shi (JP)

( * ) Notice: Subject to any disclaimer, the term of this patent is extended or adjusted under 35 U.S.C. 154(b) by 0 days.

(21) Appl. No.: 13/923,477

(22) Filed: Jun. 21, 2013

(65) Prior Publication Data

US 2013/0288573 A1 Oct. 31, 2013

Related U.S. Application Data

(62) Division of application No. 12/363,004, filed on Jan. 30, 2009, now abandoned.

(30) Foreign Application Priority Data

Feb. 1, 2008 (JP) .................................. 2008-023227

(51) Int. Cl.
    B24B 37/04 (2012.01)
    C09G 1/02 (2006.01)
    H01L 21/321 (2006.01)

(52) U.S. Cl.
    CPC .............. B24B 37/044 (2013.01); C09G 1/02 (2013.01); H01L 21/3212 (2013.01)

(58) Field of Classification Search
    None
    See application file for complete search history.

(56) References Cited

U.S. PATENT DOCUMENTS

| | | | |
|---|---|---|---|
| 3,715,842 A | 2/1973 | Tredinnick et al. | |
| 4,169,337 A | 10/1979 | Payne | |
| 4,462,188 A | 7/1984 | Payne | |
| 4,588,421 A | 5/1986 | Payne | |
| 5,230,833 A | 7/1993 | Romberger et al. | |
| 5,352,277 A | 10/1994 | Sasaki | |
| 5,916,819 A | 6/1999 | Skrovan et al. | |
| 6,099,604 A | 8/2000 | Sandhu et al. | |
| 6,454,820 B2 | 9/2002 | Hagihara et al. | |
| 7,314,578 B2 | 1/2008 | Choi et al. | |
| 2003/0228762 A1 | 12/2003 | Moeggenborg et al. | |
| 2004/0040217 A1* | 3/2004 | Takashina et al. | 51/307 |
| 2004/0237413 A1 | 12/2004 | Shida et al. | |
| 2005/0090109 A1* | 4/2005 | Carter et al. | 438/692 |
| 2006/0124586 A1 | 6/2006 | Kobayashi et al. | |
| 2006/0124591 A1* | 6/2006 | Haga et al. | 216/88 |
| 2006/0234509 A1* | 10/2006 | Small et al. | 438/692 |
| 2006/0242912 A1 | 11/2006 | Roh et al. | |
| 2007/0142488 A1* | 6/2007 | Datko et al. | 521/142 |
| 2007/0181534 A1* | 8/2007 | Kamimura | 216/88 |
| 2007/0251155 A1* | 11/2007 | Dysard et al. | 51/298 |
| 2007/0281486 A1 | 12/2007 | Han et al. | |
| 2007/0287362 A1 | 12/2007 | Takenouchi | |
| 2011/0275217 A1 | 11/2011 | Satou et al. | |

FOREIGN PATENT DOCUMENTS

| | | |
|---|---|---|
| JP | 2002-190458 A1 | 5/2002 |
| JP | 2005-175498 A1 | 6/2005 |
| JP | 2007-144612 A | 6/2007 |
| JP | 2007-194261 | 8/2007 |
| JP | 2008-021764 | 1/2008 |
| JP | 2008021764 | 1/2008 |

OTHER PUBLICATIONS

Machine Translation of Japanese Laid Open Patent Application Publication JP 2007-144612 A.

* cited by examiner

*Primary Examiner* — Shamim Ahmed
*Assistant Examiner* — Bradford Gates
(74) *Attorney, Agent, or Firm* — Vidas, Arrett & Steinkraus

(57) ABSTRACT

The present invention provides a polishing composition that can be suitably used in polishing of polysilicon, and a polishing method using the polishing composition. The polishing composition contains a nitrogen-containing nonionic surfactant and abrasive grains and has a pH of 9 to 12. The content of the nitrogen-containing nonionic surfactant in the polishing composition is preferably 20 to 500 ppm. The abrasive grains contained in the polishing composition are preferably colloidal silica. The average primary particle diameter of the abrasive grains contained in the polishing composition is preferably 10 to 90 nm. The content of the abrasive grains in the polishing composition is preferably 1.0 to 5.0% by mass.

11 Claims, No Drawings

POLISHING COMPOSITION AND POLISHING METHOD USING THE SAME

CROSS-REFERENCE TO RELATED APPLICATIONS

This application is a divisional of U.S. Ser. No. 12/363,004 filed Jan. 20, 2009.

STATEMENT REGARDING FEDERALLY SPONSORED RESEARCH

Not applicable.

BACKGROUND OF THE INVENTION

The present invention relates to a polishing composition used mainly in polishing of polysilicon and to a polishing method using the polishing composition.

In semiconductor device manufacturing processes, for example, polishing may be conducted to remove part of polysilicon film formed on substrates. In this polishing, it is not only desirable to remove polysilicon at high rate, but it is also important to minimize the occurrence of dishing that reduces the flatness of the surface of polished polysilicon film. Dishing refers to a phenomenon in which after part of polysilicon film not to be removed is polished and removed, depressions are formed on the surface of the polished polysilicon film. Many of the previously known polishing compositions cannot be practically used because they do not meet the performance requirements for polysilicon removal rate and dishing sufficiently.

Examples of a document relating to the present invention include Japanese Laid-Open Patent Publication Nos. 2002-190458 and 2005-175498.

BRIEF SUMMARY OF THE INVENTION

An objective of the present invention is to provide a polishing composition that can be suitably used in polishing of polysilicon, and a polishing method using the polishing composition.

In accordance with a first aspect of the present invention, a polishing composition is provided. The polishing composition contains abrasive grains and a nitrogen-containing nonionic surfactant. The pH of the polishing composition is 9 to 12.

In accordance with a second aspect of the present invention, a polishing method is provided. The polishing method includes: preparing a polishing composition according to the first aspect; and polishing polysilicon by using the polishing composition.

Other aspects and advantages of the invention will become apparent from the following description, illustrating by way of example the principles of the invention.

DETAILED DESCRIPTION OF THE INVENTION

While this invention may be embodied in many different forms, there are described in detail herein a specific preferred embodiment of the invention. This description is an exemplification of the principles of the invention and is not intended to limit the invention to the particular embodiment illustrated A description of one embodiment of the present invention is given below.

A polishing composition according to the present embodiment is manufactured by mixing a nitrogen-containing nonionic surfactant and abrasive grains into water, along with a pH adjuster as needed, so that the pH of the polishing composition falls into the range of 9 to 12. For this reason, the polishing composition contains a nitrogen-containing nonionic surfactant, abrasive grains, and water, and further contains a pH adjuster as needed.

The polishing composition of the present embodiment is mainly used in polishing of polysilicon, more specifically in polishing conducted to remove part of polysilicon film formed on substrates such as single-crystal silicon substrates.

Examples of the nitrogen-containing nonionic surfactant contained in the polishing composition include polyoxyethylene alkyl amino ether and polyoxyethylene fatty acid amide.

The content of the nitrogen-containing nonionic surfactant in the polishing composition is preferably 20 ppm or more. As the content of the nitrogen-containing nonionic surfactant increases, the occurrence of dishing on the surface of the polysilicon film polished by using the polishing composition is reduced more. In this respect, if the content of the nitrogen-containing nonionic surfactant in the polishing composition is 20 ppm or more, it is easy to reduce the occurrence of dishing on the surface of the polished polysilicon film to a level particularly suitable for practical use.

In addition, the content of the nitrogen-containing nonionic surfactant in the polishing composition is preferably 500 ppm or less. As the content of the nitrogen-containing nonionic surfactant decreases, the rate of removal of polysilicon by the polishing composition increases. In this respect, if the content of the nitrogen-containing nonionic surfactant in the polishing composition is 500 ppm or less, it is easy to obtain a rate of removal of polysilicon by the polishing composition that is at a level particularly suitable for practical use.

Examples of the abrasive grains contained in the polishing composition include colloidal silica, fumed silica, and powdered calcined silica, and among them colloidal silica is preferable. When colloidal silica is used, the occurrence of dishing on the surface of the polysilicon film polished by using the polishing composition is reduced more greatly than when other abrasive grains are used.

The content of the abrasive grains in the polishing composition is preferably 0.1% by mass or more, more preferably 0.3% by mass or more, and even more preferably 1.0% by mass or more. As the content of the abrasive grains increases, the rate of removal of polysilicon by the polishing composition increases. In this respect, if the content of the abrasive grains in the polishing composition is 0.1% by mass or more, more specifically 0.3% by mass or more, or even more specifically 1.0% by mass or more, it is easy to increase the rate of removal of polysilicon by the polishing composition to a level particularly suitable for practical use.

In addition, the content of the abrasive grains in the polishing composition is preferably 15% by mass or less, more preferably 10% by mass or less, and even more preferably 5.0% by mass or less. As the content of the abrasive grains decreases, the dispersion of the abrasive grains in the polishing composition increases. In this respect, if the content of the abrasive grains in the polishing composition is 15% by mass or less, more specifically 10% by mass or less, or even more specifically 5.0% by mass or less, it is easy to increase the dispersion of the abrasive grains in the polishing composition to a level particularly suitable for practical use.

The average primary particle diameter of the abrasive grains contained in the polishing composition is preferably 3 nm or more, more preferably 5 nm or more, and even more preferably 10 nm or more. As the average primary particle diameter of the abrasive grains increases, the rate of removal of polysilicon by the polishing composition increases. In this respect, if the average primary particle diameter of the abrasive grains is 3 nm or more, more specifically 5 nm or more, or even more specifically 10 nm or more, it is easy to increase the rate of removal of polysilicon by the polishing composition to a level particularly suitable for practical use.

In addition, the average primary particle diameter of the abrasive grains contained in the polishing composition is preferably 200 nm or less, more preferably 150 nm or less, and even more preferably 90 nm or less. As the average primary particle diameter of the abrasive grains decreases, the dispersion of the abrasive grains in the polishing composition increases. In this respect, if the average primary particle diameter of the abrasive grains is 200 nm or less, more specifically 150 nm or less, or even more specifically 90 nm or less, it is easy to increase the dispersion of the abrasive grains in the polishing composition to a level particularly suitable for practical use.

The pH adjuster contained in the polishing composition as needed is not particularly limited, and any alkali can be used in appropriate amounts to adjust the pH of the polishing composition to a desired value between 9 and 12. Examples of an alkali that can be used as the pH adjuster include tetramethylammonium hydroxide, ethylamine, and ethanolamine.

The present embodiment provides the following advantages.

If polysilicon film is polished by using the polishing composition of the present embodiment, a high rate of removal of polysilicon is obtained and at the same time the occurrence of dishing on the surface of the polished polysilicon film is reduced greatly. Therefore, the polishing composition is used suitably in polishing of polysilicon, particularly in polishing conducted to remove part of polysilicon film formed on substrates. The reason why the advantages mentioned above are obtained by using the polishing composition of the present embodiment is not understood in detail, but it is estimated that the advantages are brought about by the modification of the surface of the polysilicon film by the nitrogen-containing nonionic surfactant contained in the polishing composition.

The embodiment may be modified as follows.

The polishing composition of the embodiment may contain two or more types of nitrogen-containing nonionic surfactants.

The polishing composition of the embodiment may contain two or more types of abrasive grains.

Additives such as chelating agents, water-soluble polymers, surfactants other than nitrogen-containing nonionic surfactants having a monooxyethylene group or a polyoxyethylene group, antiseptics, fungicides, and rust preventives may be added to the polishing composition of the embodiment as needed.

The polishing composition of the embodiment may be prepared by diluting the stock solution of the polishing composition with water.

Next, the present invention is described more specifically by using Examples and Comparative Examples.

In Examples 1 to 23 and Comparative Examples 1 and 2, polishing compositions were prepared by adding a pH adjuster and water and further a nitrogen-containing nonionic surfactant to abrasive grains. In Comparative Examples 3 to 5, polishing compositions were prepared by adding a pH adjuster and water and further a compound as an alternative to the specific nitrogen-containing nonionic surfactant to abrasive grains. Table 1 shows details of the nitrogen-containing nonionic surfactant or its alternative and the abrasive grains contained in each polishing composition as well as the results of the pH measurement of each polishing composition. The pH adjuster used for each polishing composition is tetramethylammonium hydroxide.

In Table 1,
A1 indicates colloidal silica having an average primary particle diameter of 10 nm,
A2 indicates colloidal silica having an average primary particle diameter of 30 nm,
A3 indicates colloidal silica having an average primary particle diameter of 70 nm,
A4 indicates colloidal silica having an average primary particle diameter of 90 nm,
A5 indicates colloidal silica having an average primary particle diameter of 130 nm,
B1 indicates polyoxyethylene alkyl amino ether as shown by structural formula (1) below (m=5),
B2 indicates polyoxyethylene fatty acid amide as shown by structural formula (2) below (m=5),
B3 indicates hydroxyethyl cellulose having a mean molecular weight of about 1,200,000 as shown by structural formula (3) below (m=2 to 3),
B4 indicates polyoxyethylene polyoxypropylene glycol as shown by structural formula (4) below (m1+m2=25, n=30), and
B5 indicates polyoxyethylene alkyl ether as shown by structural formula (5) below (m=10).

(1)

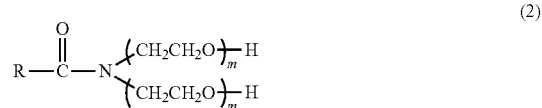

(2)

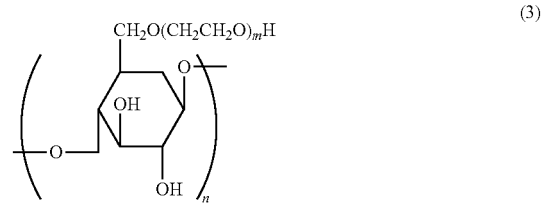

(3)

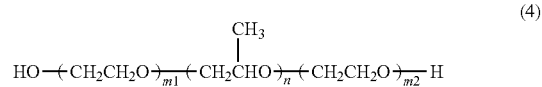

(4)

(5)

The polysilicon removal rate measured when the surface of a polysilicon film blanket wafer having a diameter of 200 mm was polished by using each polishing composition under the conditions shown in Table 2 is entered in the "Polysilicon removal rate" field in Table 1. The polysilicon removal rate value was determined by dividing the difference between the thickness of each substrate before polishing and that after polishing by polishing time (60 seconds). The thickness of each substrate before polishing and that after polishing were measured by using LAMBDA ACE VM-2030, an optical interferometric film thickness measurement system manufactured by DAINIPPON SCREEN MFG. CO., LTD.

The amount of dishing (depth of a depression formed by dishing) measured after when the surface of a polysilicon film patterned wafer having a diameter of 200 mm was polished by using each polishing composition under the conditions shown in Table 2 is entered in the "Amount of dishing" field in Table 1. After an endpoint signal was detected, the polysilicon film patterned wafer was further polished for a time corresponding to 40% of the polishing time taken to detect the endpoint signal before completion of the polishing.

TABLE 1

|  | Abrasive grains | | Nitrogen-containing nonionic surfactant or alternative compound | | | Polysilicon removal rate (Å/min) | Amount of dishing (Å) |
|---|---|---|---|---|---|---|---|
|  | Type | Content (% by mass) | Type | Content (ppm) | pH |  |  |
| Example 1 | A1 | 2.5 | B1 | 100 | 10.2 | 1109 | 664 |
| Example 2 | A2 | 2.5 | B1 | 100 | 10.2 | 1763 | 561 |
| Example 3 | A3 | 2.5 | B1 | 100 | 10.2 | 1713 | 398 |
| Example 4 | A4 | 2.5 | B1 | 100 | 10.2 | 1613 | 273 |
| Example 5 | A5 | 2.5 | B1 | 100 | 10.2 | 1624 | 389 |
| Example 6 | A4 | 0.5 | B1 | 100 | 10.2 | 1409 | 431 |
| Example 7 | A4 | 1.0 | B1 | 100 | 10.2 | 1561 | 375 |
| Example 8 | A4 | 2.5 | B1 | 100 | 10.2 | 1613 | 273 |
| Example 9 | A4 | 5.0 | B1 | 100 | 10.2 | 1721 | 312 |
| Example 10 | A4 | 7.5 | B1 | 100 | 10.2 | 1905 | 368 |
| Comparative Example 1 | A4 | 2.5 | B1 | 100 | 8.0 | 485 | 521 |
| Example 11 | A4 | 2.5 | B1 | 100 | 9.0 | 1587 | 254 |
| Example 12 | A4 | 2.5 | B1 | 100 | 10.2 | 1613 | 273 |
| Example 13 | A4 | 2.5 | B1 | 100 | 11.0 | 1899 | 421 |
| Example 14 | A4 | 2.5 | B1 | 100 | 12.0 | 1998 | 590 |
| Comparative Example 2 | A4 | 2.5 | B1 | 100 | 13.0 | 231 | 988 |
| Example 15 | A2 | 2.5 | B2 | 50 | 10.2 | 1966 | 469 |
| Example 16 | A3 | 2.5 | B2 | 50 | 10.2 | 1885 | 503 |
| Example 17 | A4 | 2.5 | B2 | 50 | 10.2 | 1840 | 480 |
| Comparative Example 3 | A4 | 2.5 | B3 | 50 | 10.2 | 1457 | 720 |
| Comparative Example 4 | A4 | 2.5 | B4 | 50 | 10.2 | 1521 | 734 |
| Comparative Example 5 | A4 | 2.5 | B5 | 50 | 10.2 | 591 | 708 |
| Example 18 | A4 | 2.5 | B1 | 20 | 10.2 | 2451 | 672 |
| Example 19 | A4 | 2.5 | B1 | 50 | 10.2 | 2310 | 577 |
| Example 20 | A4 | 2.5 | B1 | 70 | 10.2 | 2139 | 503 |
| Example 21 | A4 | 2.5 | B1 | 85 | 10.2 | 1963 | 431 |
| Example 22 | A4 | 2.5 | B1 | 100 | 10.2 | 1613 | 273 |
| Example 23 | A4 | 2.5 | B1 | 500 | 10.2 | 712 | 569 |

TABLE 2

Polisher: "Mirra" manufactured by Applied Materials, Inc.
Platen diameter: 380 mm
Polishing pad: "IC-1010 M-Groove" manufactured by Rohm and Haas Company
Polishing pressure: approximately 14 kPa (=2.0 psi)
Rotation speed of machine platen: 63 rpm
Rotation speed of head: 57 rpm
Feeding rate of polishing composition: 200 mL/min.
Dressing: In-situ (#100 diamond dresser used)

As shown in Table 1, the polishing compositions according to Examples 1 to 23 provided a polysilicon removal rate of 500 Å/min or more, which is practically acceptable, and an amount of dishing of 700 Å or less, which is practically acceptable. In contrast, the polishing compositions according to Comparative Examples 1 to 2 whose pH went beyond the range of 9 to 12 provided a polysilicon removal rate of less than 500 Å/min, which is not practically acceptable. In addition, the polishing compositions according to Comparative Examples 3 to 5 that did not contain the specific nitrogen-containing nonionic surfactant provided an amount of dishing of more than 700 Å, which is not practically acceptable.

What is claimed is:

1. A method of polishing polysilicon, comprising:
preparing a polishing composition containing colloidal silica abrasive grains and a nitrogen-containing nonionic surfactant selected from the group consisting of a polyoxyethylene alkyl amino ether and a polyoxyethylene fatty acid amide, wherein the nitrogen-containing nonionic surfactant is contained in the polishing composition in an amount of 20 to 85 ppm, and wherein the polishing composition has a pH of greater than 9 to 12; and
using the polishing composition to polish polysilicon.

2. The method according to claim 1, wherein the nitrogen-containing nonionic surfactant is polyoxyethylene alkyl amino ether.

3. The method according to claim 1, wherein the nitrogen-containing nonionic surfactant is polyoxyethylene fatty acid amide.

4. The method according to claim 1, wherein the average primary particle diameter of the silica abrasive grains is 10 to 90 nm.

5. The method according to claim 1, wherein the silica abrasive grains are contained in the polishing composition in an amount of 1.0 to 5.0% by mass.

6. A method of polishing polysilicon, comprising:
preparing a polishing composition consisting of colloidal silica abrasive grains, a pH adjuster, water, and one or more types of nitrogen-containing nonionic surfactants selected from the group consisting of a polyoxyethylene alkyl amino ether and a polyoxyethylene fatty acid amide, wherein the polishing composition has a pH of greater than 9 to 12; and using the polishing composition to polish polysilicon.

7. The method according to claim 6, wherein the one or more types of nitrogen-containing nonionic surfactants are contained in the polishing composition in an amount of 20 to 85 ppm.

8. The method according to claim 6, wherein the one or more types of nitrogen-containing nonionic surfactant are polyoxyethylene fatty acid amide.

9. A method of polishing polysilicon, comprising:
preparing a polishing composition consisting of colloidal silica abrasive grains, a pH adjuster, water, one or more types of nitrogen-containing nonionic surfactants selected from the group consisting of a polyoxyethylene alkyl amino ether and a polyoxyethylene fatty acid amide, and at least one of a chelating agent, a water-soluble polymer, a surfactant other than nitrogen-containing nonionic surfactants, an antiseptic, a fungicide, and a rust preventive, wherein the polishing composition has a pH of greater than 9 to 12; and using the polishing composition to polish polysilicon.

10. The method according to claim 9, wherein the one or more types of nitrogen-containing nonionic surfactants are contained in the polishing composition in an amount of 20 to 85 ppm.

11. The method according to claim 9, wherein the one or more types of nitrogen-containing nonionic surfactant are polyoxyethylene fatty acid amide.

* * * * *